(12) United States Patent
Seo

(10) Patent No.: US 7,651,898 B2
(45) Date of Patent: Jan. 26, 2010

(54) METHOD FOR FABRICATING SEMICONDUCTOR DEVICE

(75) Inventor: Dae-Young Seo, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 256 days.

(21) Appl. No.: 11/319,249

(22) Filed: Dec. 27, 2005

(65) Prior Publication Data

US 2006/0223297 A1  Oct. 5, 2006

(30) Foreign Application Priority Data

Mar. 31, 2005  (KR) .................... 10-2005-0027361

(51) Int. Cl.
*H01L 21/00* (2006.01)

(52) U.S. Cl. ............... 438/157; 438/672; 257/E21.621; 257/E21.635

(58) Field of Classification Search .............. 438/157, 438/637, 672; 257/E21.621, E21.635
See application file for complete search history.

(56) References Cited

U.S. PATENT DOCUMENTS

| | | | | |
|---|---|---|---|---|
| 5,079,606 A * | 1/1992 | Yamamura et al. | .......... | 257/365 |
| 6,410,443 B1 * | 6/2002 | Avanzino et al. | ............ | 438/693 |
| 6,548,347 B2 | 4/2003 | Juengling | | |
| 6,642,097 B2 | 11/2003 | Tu | | |
| 6,800,522 B2 * | 10/2004 | Lee | ............................ | 438/253 |
| 2002/0094631 A1 * | 7/2002 | Lee | ............................ | 438/238 |
| 2004/0219462 A1 * | 11/2004 | Chen et al. | .................. | 430/311 |

FOREIGN PATENT DOCUMENTS

| | | |
|---|---|---|
| CN | 1119346 | 3/1996 |
| CN | 1192051 | 9/1998 |
| CN | 1255236 | 6/2000 |

* cited by examiner

*Primary Examiner*—Asok K Sarkar
*Assistant Examiner*—Julia Slutsker
(74) *Attorney, Agent, or Firm*—Blakely, Sokoloff, Taylor & Zafman LLP (57) ABSTRACT

First gate lines are formed on a substrate. An insulation layer is formed on the substrate and the first gate lines. The insulation layer disposed between the first gate lines is selectively etched, to thereby form first openings. Landing plugs are buried into the first openings. The insulation layer disposed on the first gate lines is etched until upper portions of the first gate lines are exposed, thereby obtaining second openings. Second gate lines are formed inside the second openings.

13 Claims, 8 Drawing Sheets

METHOD FOR FABRICATING SEMICONDUCTOR DEVICE

FIELD OF THE INVENTION

An embodiment of the present invention relates to a method for fabricating a semiconductor device; and more particularly, to a method for fabricating a gate line and a landing contact plug using a damascene process.

DESCRIPTION OF RELATED ARTS

Typically, semiconductor devices include a plurality of unit devices. As the semiconductor devices have been highly integrated, the unit devices should be formed with a high density on a fixed cell area. Accordingly, the sizes of the unit devices, i.e., transistors and capacitors, have been decreased. Particularly, in the semiconductor devices such as dynamic random access memory (DRAM) devices, as a design rule has been decreased, the sizes of the semiconductor devices formed inside of the cell have also been decreased. Recently, the semiconductor device has a minimum line width of less than 0.1 µm. Even a line width size of less than 80 nm is needed. Accordingly, there are a lot of difficulties in fabricating such semiconductor devices.

In the semiconductor devices having line width of less than 80 nm, if a photolithography process is employed by using argon fluoride (ArF) having a wave length of 193 nm, an additional condition which prevents an incidence of photoresist deformation generated during an etching process is required. This is in addition to a conventionally required condition for the etching process, i.e., an accurate pattern formation and a vertical etch profile. Accordingly, in 80 nm level semiconductor devices, it is important to develop a process condition that simultaneously satisfies the conventionally required condition for the etching process and the additional condition that prevents the pattern deformation.

Meanwhile, as the integration scale of semiconductor devices has been accelerated, constituent elements forming the semiconductor devices are formed in a stack structure and accordingly, the concept of a contact plug or a pad is introduced.

As for the contact plug, this is a plug for a landing plug contact (LPC) which increases a contact area within a minimum area in a lower portion, and has an upper portion larger than the lower portion to increase a process margin with respect to a subsequent process in the upper portion.

A LPC process is a technology which secures an overlay margin during a subsequent contact process, by burying a conductive material in advance in a gap between gate patterns in which a bit line contact and a storage node contact are formed.

FIGS. 1A to 1G are cross-sectional views illustrating a conventional method for fabricating a semiconductor device.

Figure 1A:
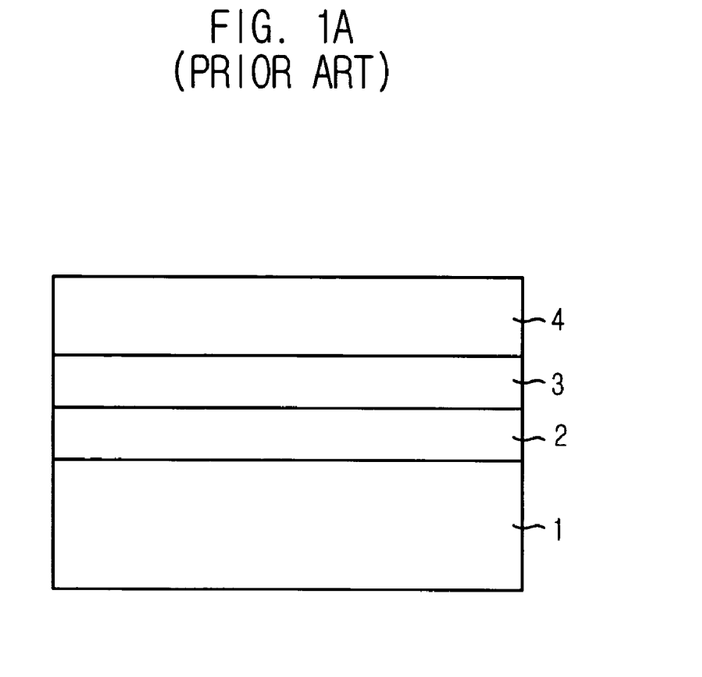
FIGS. 1A to 1G are cross-sectional views illustrating a conventional method for fabricating a semiconductor device.

As shown in FIG. 1A, an isolation process is performed in a substrate 1, thereby forming a device isolation layer (not shown).

Next, a gate oxidation process is employed and thus, a gate oxide layer (not shown) is formed on the substrate 1.

Next, a gate conductive layer is formed on the gate oxide layer. At this time, the gate conductive layer is formed in a stack structure of a polysilicon layer 2 and a tungsten layer 3, and a gate hard mask layer 4 is deposited on the tungsten layer 3. A photoresist pattern (not shown) is formed on the gate hard mask layer 4.

Figure 1B:
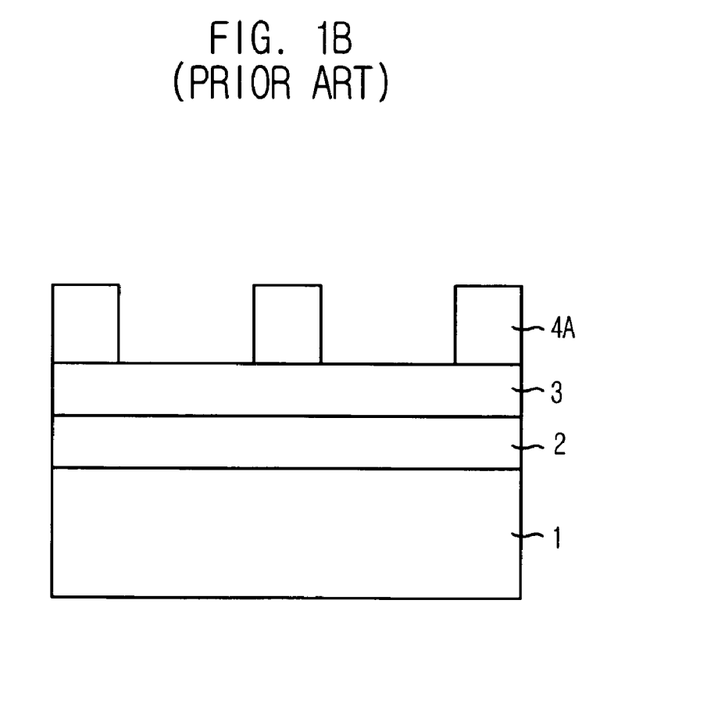

As shown in FIG. 1B, the hard mask layer 4 is patterned by using the photoresist pattern (not shown) as an etch mask. A reference numeral 4A indicates the gate hard masks. After the patterning of the gate hard mask layer 4, the photoresist pattern (not shown) is stripped. Afterwards, a cleaning process is employed.

Figure 1C:
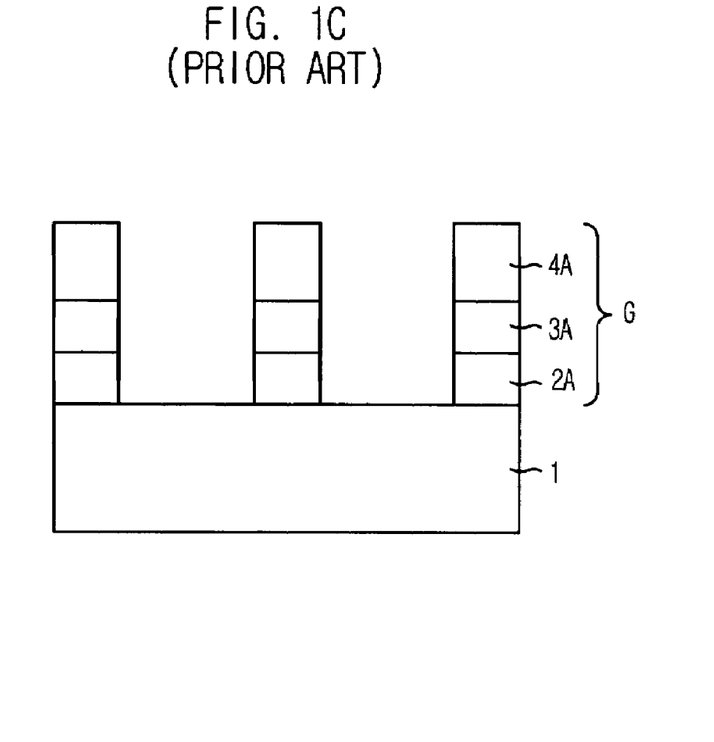

As shown in FIG. 1C, the tungsten layer 3, the polysilicon layer 2 and the gate oxide layer (not shown) are patterned by using the gate hard masks 4A as an etch mask, thereby forming a plurality of gate lines G. Hereinafter, the patterned tungsten layer and the patterned polysilicon layers are denoted with reference numerals 3A and 2A, respectively.

Figure 1D:
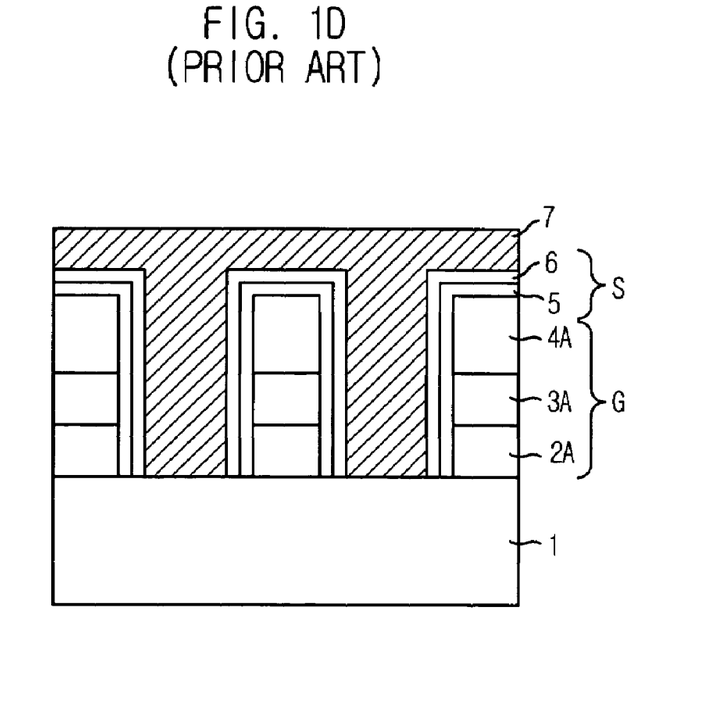

As shown in FIG. 1D, a spacer material is deposited on an entire surface of the above resulting structure and then, an etching process is employed to form a plurality of spacers S. The spacers S are formed in a stack structure of a silicon oxide ($SiO_2$) layer 5 and a silicon nitride ($Si_3N_4$) layer 6.

Next, an inter-layer insulation layer 7 is formed over the spacers, filling the gaps between the gate lines G.

At this time, the inter-layer insulation layer 7 is formed by using a material such as a borosilicate glass (BSG) layer, a borophosphosilicate glass (BPSG) layer, a phosphosilicate glass (PSG) layer, a tetraethyl orthosilicate (TEOS) layer, a high density plasma (HDP) layer, a spin-on-glass (SOG) layer, and an advanced planarization layer (APL). Also, the inter-layer insulation layer 7 can use an inorganic or organic based low-k dielectric material.

Figure 1E:
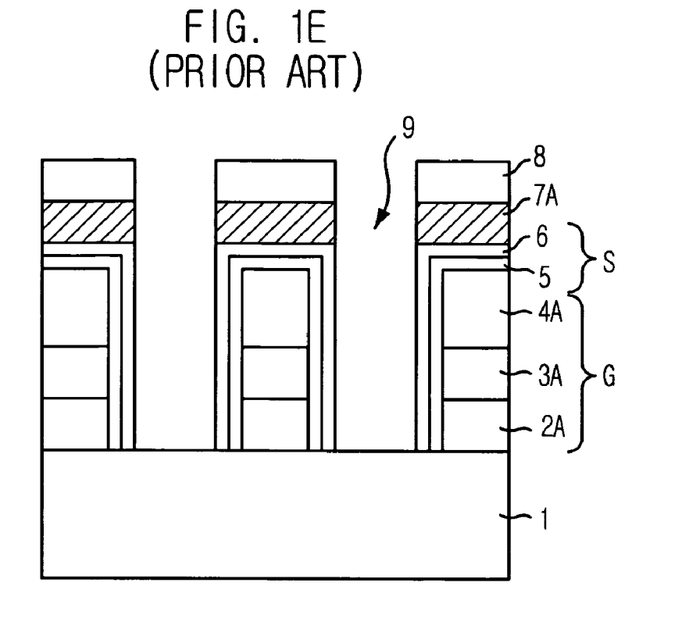

As shown in FIG. 1E, a plurality of LPC masks 8 are formed on the inter-layer insulation layer 7 to form a plurality of contact holes 9 for landing plug contacts (hereinafter, referred to as "LPC holes"). At this time, the LPC masks 8 use T-type LPC masks or I-type LPC masks.

Predetermined portions of the inter-layer insulation layer 7 are patterned by using the LPC masks 8. Herein, the patterned inter-layer insulation layer 7 is denoted with a reference numeral of 7A. Then, the LPC holes 9 are formed between the gate lines.

Figure 1F:
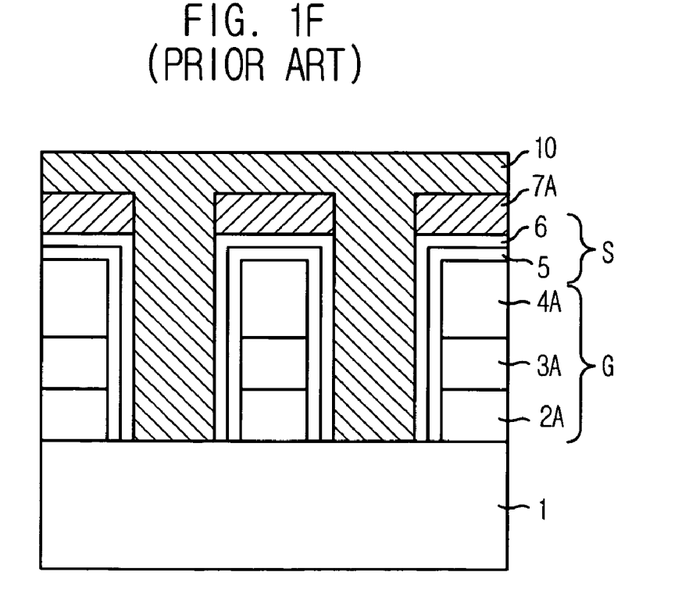

As shown in FIG. 1F, a LPC material 10 is deposited on the resulting structure, filling the LPC holes 9. At this time, a polysilicon layer is used as the LPC material 10.

Figure 1G:
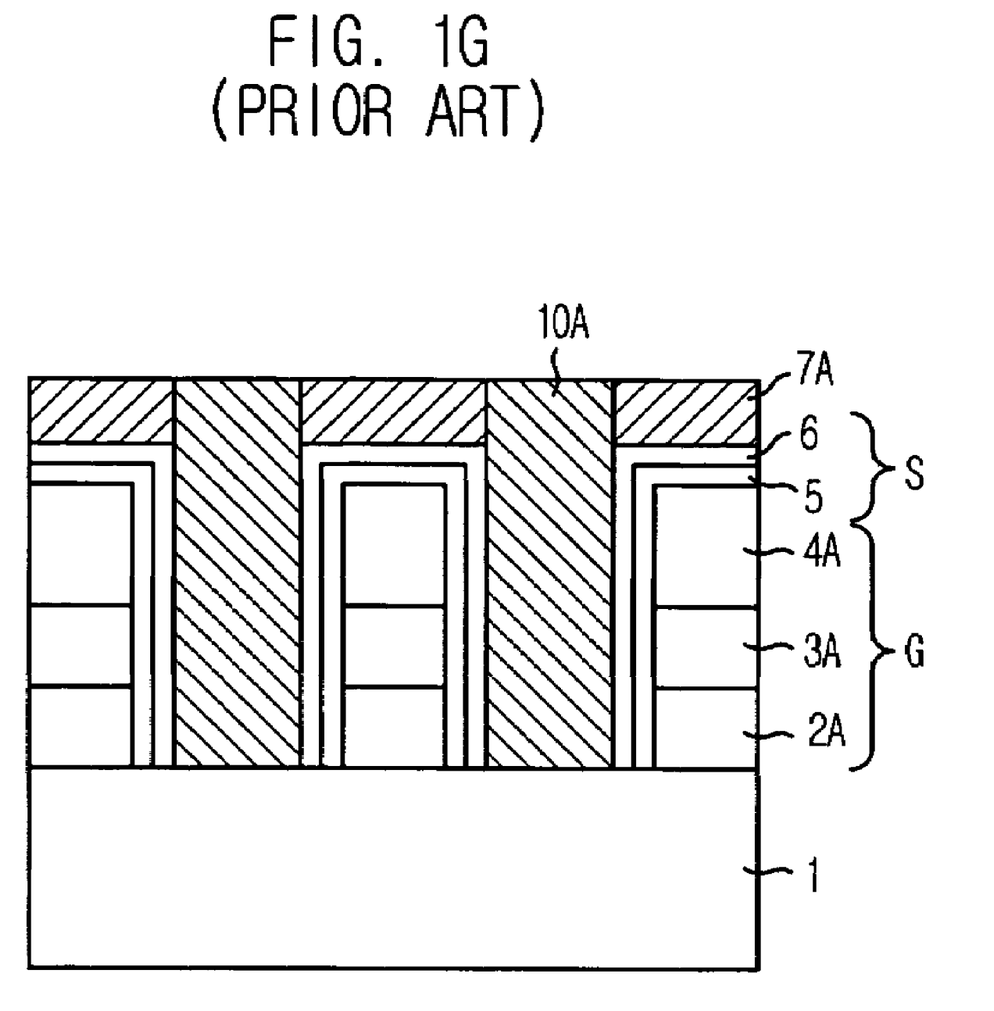

As shown in FIG. 1G, a chemical mechanical polishing (CMP) process or an etch-back process is employed, thereby planarizing the LPC material until the patterned inter-layer insulation layer 7A is exposed. As a result, a plurality of plugs for landing plug contacts (hereinafter, referred to as "LPC plugs") 10A are formed.

Afterwards, an inter-layer insulation layer (not shown) is deposited and then, a typical bit line fabrication process and a typical capacitor formation process are performed.

Typically, for DRAM devices, the LPC process is performed after the gate lines are formed.

Furthermore, as a line width of an interconnection line and a gap between the interconnection lines are decreased, i.e., a design rule is decreased up to a size equal to or less than 0.05 µm, it becomes very important to form a metal gate layer as one element for the semiconductor device.

Particularly, through an etching process and a lithography process, damage such as evaporation of the metal layer may be generated.

Accordingly, as a distance between the unit devices of the DRAM device is decreased and a height of a gate line is increased, the gate line formation reaches a limitation and LPC formation also faces a difficulty. That is, during forming the gate lines, it may be difficult to control critical dimensions of the gate lines, and yields of products may be decreased, due to damage in the gate lines and a contact hole not-open event.

SUMMARY OF THE INVENTION

An embodiment of the invention is a method for fabricating a semiconductor device suitable to control a critical dimension (CD) of a gate line and to prevent an incidence that a landing plug contact hole is not properly opened.

In accordance with one aspect of the present invention, there is provided a method for fabricating a semiconductor device, including: forming a plurality of first gate lines on a substrate; forming an insulation layer on the substrate and the first gate lines; selectively etching the insulation layer disposed between the first gate lines to thereby form a plurality of first openings; forming a plurality of landing plugs buried into the first openings; etching the insulation layer disposed on the first gate lines until upper portions of the first gate lines are exposed, thereby obtaining a plurality of second openings; and forming a plurality of second gate lines inside the second openings.

BRIEF DESCRIPTION OF THE INVENTIONS

The above features will become better understood with respect to the following description of the preferred embodiments given in conjunction with the accompanying drawings, in which.

DETAILED DESCRIPTION OF THE INVENTION

Hereinafter, detailed descriptions on certain embodiments of the present invention will be provided with reference to the accompanying drawings.

FIGS. 2A to 2H are cross-sectional views illustrating a method for fabricating a semiconductor device in accordance with an embodiment of the present invention.

Figure 2A:
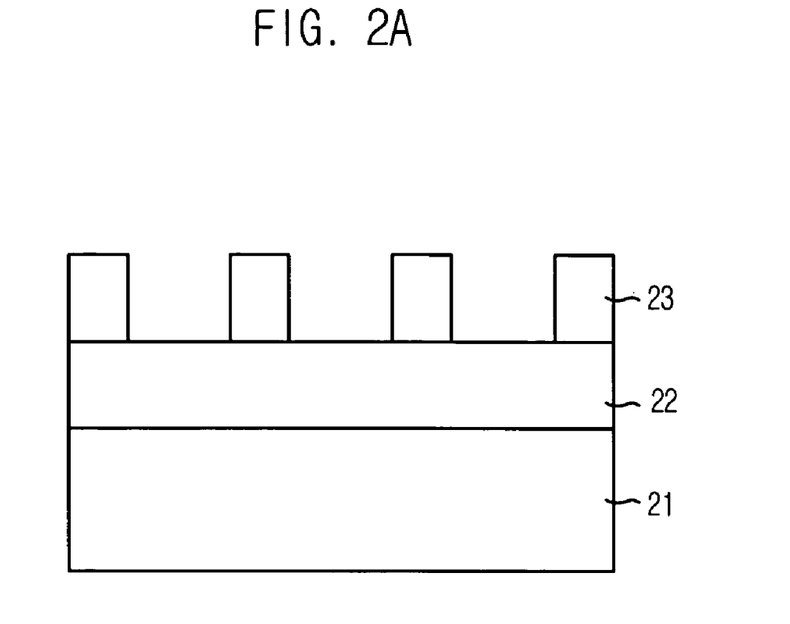
FIGS. 2A to 2H are cross-sectional views illustrating a method for fabricating a semiconductor device in accordance with an embodiment of the present invention.

As shown in FIG. 2A, an isolation process is performed in a substrate 21, thereby forming a device isolation layer (not shown).

Next, a gate oxidation is performed, thereby forming a gate oxide layer (not shown) on the substrate 21.

Next, a gate conductive layer 22 is formed on the gate oxide layer (not shown). At this time, the gate conductive layer 22 uses a polysilicon layer. A plurality of photoresist patterns 23 are formed on the gate conductive layer 22.

Figure 2B:
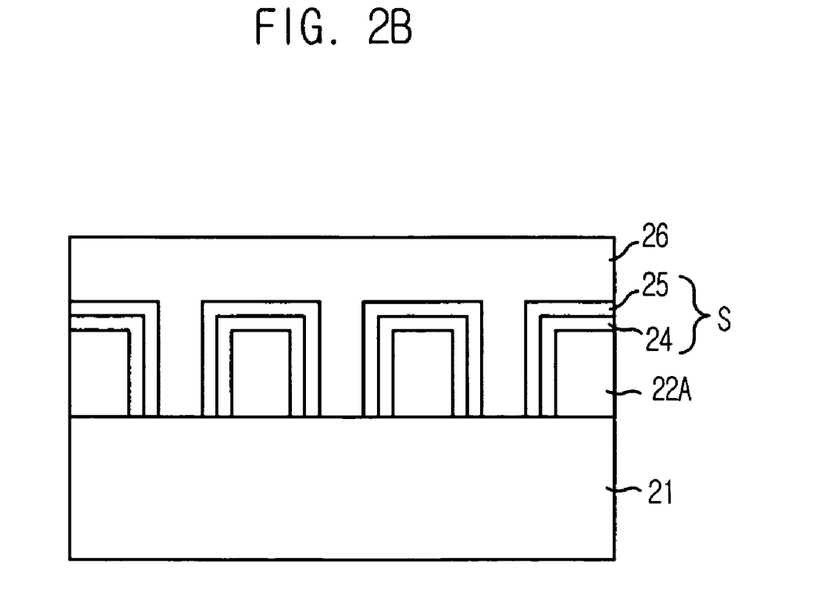

As shown in FIG. 2B, the gate conductive layer 22 and the gate oxide layer (not shown) are patterned by using the photoresist patterns 23 as an etch mask. Herein, a reference numeral 22A denotes the patterned gate conductive layer. Thus, a plurality of first gate lines with a thickness ranging from approximately 200 Å to approximately 1,000 Å are formed.

At this time, a critical dimension of an individual first gate line is controlled by using the gate conductive layer 22A.

The first gate lines are patterned and afterwards, the photoresist patterns 23 are stripped. Then, a cleaning process is performed.

Next, a spacer material is deposited on the above resulting structure and then, a spacer etching process is employed to form plurality of spacers S. The spacers S include a stack structure of a silicon oxide ($SiO_2$) layer 24 and a silicon nitride ($Si_3N_4$) layer 25.

Next, an inter-layer insulation layer 26 is formed over the resulting structure including the first gate lines provided with the spacers S.

At this time, the inter-layer insulation layer 26 uses a layer selected from a group consisting of a borosilicate glass (BSG) layer, a borophosphosilicate glass (BPSG) layer, a phosphosilicate glass (PSG) layer, a tetraethyl orthosilicate (TEOS) layer, a high density plasma (HDP) layer, a spin-on-glass (SOG) layer, and an advanced planarization layer (APL). Also, the inter-layer insulation layer 26 uses an inorganic or organic based low-k dielectric material.

Figure 2C:
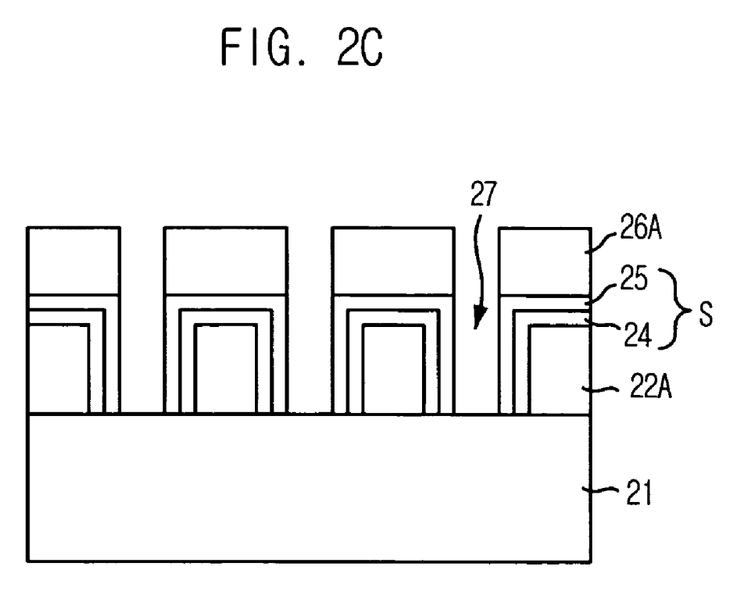

As shown in FIG. 2C, a landing plug contact (LPC) mask (not shown) is formed on the inter-layer insulation layer 26. Afterwards, predetermined portions of the inter-layer insulation layer 26 is patterned, thereby forming a plurality of contact holes for landing plug contacts (hereinafter, referred to as "LPC holes") 27. Herein, the patterned inter-layer insulation layer is denoted with a reference numeral 26A.

Figure 2D:
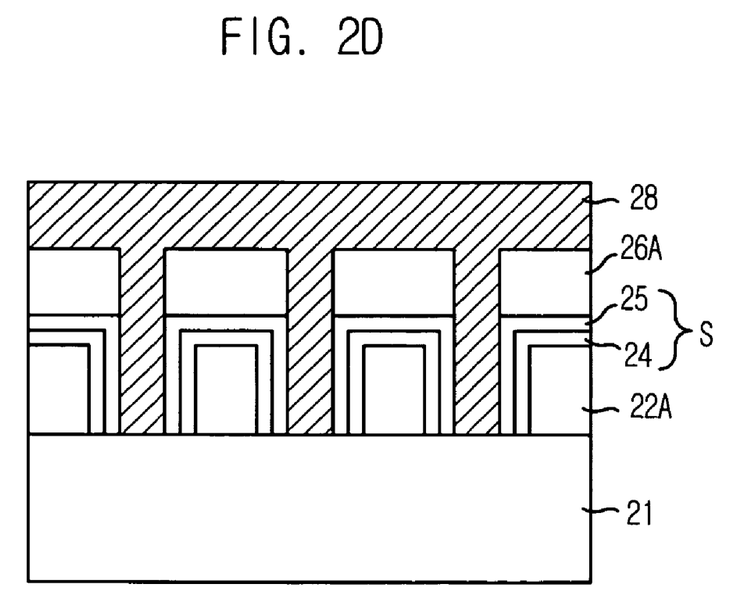

As shown in FIG. 2D, a plug material 28 is deposited by using a polysilicon layer on an entire surface of the resulting structure, filling the LPC holes 27, or an epitaxial silicon layer is grown, filling the LPC holes 27.

Figure 2E:
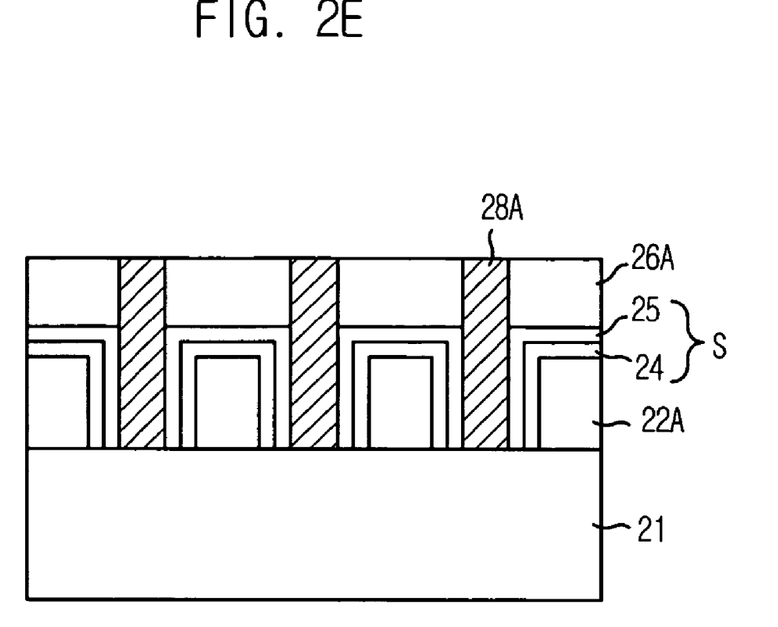

As shown in FIG. 2E, a planarization is performed by employing an etch-back process or a chemical mechanical polishing (CMP) process. Thus, a plurality of plugs for landing plug contacts (hereinafter, referred to as "LPC plugs") 28A are formed and the LPC plugs 28A are isolated.

Meanwhile, because the LPC plugs 28A are formed after the first gate lines are formed, a height of the individual LPC plug 28A is low. Because a height subjected to an etching process during forming the LPC holes 27 is low, it is possible to prevent a contact not-open event from being generated.

Figure 2F:
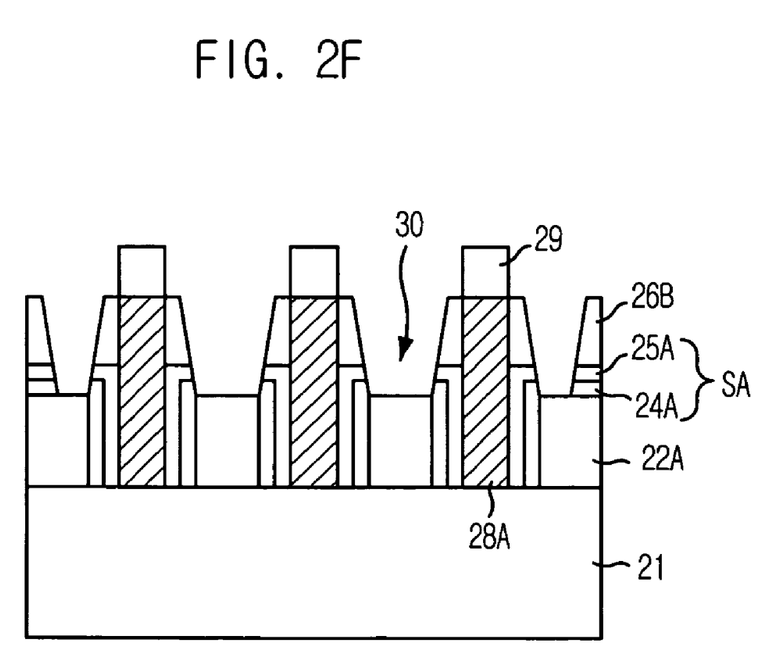

As shown in FIG. 2F, a plurality of photoresist patterns 29 are formed on the LPC plugs 28A, and the patterned inter-layer insulation layers 26A are patterned further by using the photoresist patterns 29 as an etch mask, thereby forming a plurality of openings 30. Herein, the further patterned inter-layer insulation layers are denoted with a reference numeral 26B.

At this time, the openings 30 are formed until the first gate lines are exposed, and the spacers S are further patterned while the patterned inter-layer insulation layer 26A are patterned. Herein, the further patterned spacers are denoted with a reference denotation SA.

Typically, the aforementioned method is referred as a damascene process. The damascene process uses a photolithography process. Through the damascene process, a lower insulation layer is etched in a predetermined depth as with the shape of an interconnection line, thereby forming openings. A conductive material such as aluminum, copper and tungsten is buried into the openings and then, the conductive material except for the required interconnection line is removed by using an etch-back process or a CMP process. Accordingly, the damascene process is a technology forming the interconnection lines in the shape of the initially formed openings.

Afterwards, the photoresist patterns 29 are stripped and a cleaning process is performed.

Next, although not shown, a spacer material is deposited on an entire surface of the above resulting structure. Afterwards, an etching process such as an etch-back process is performed to form other spacers on sidewalls of the further patterned inter-layer insulation layer 26B, and a process to remove the spacer material remaining on the above surface is performed.

Figure 2G:
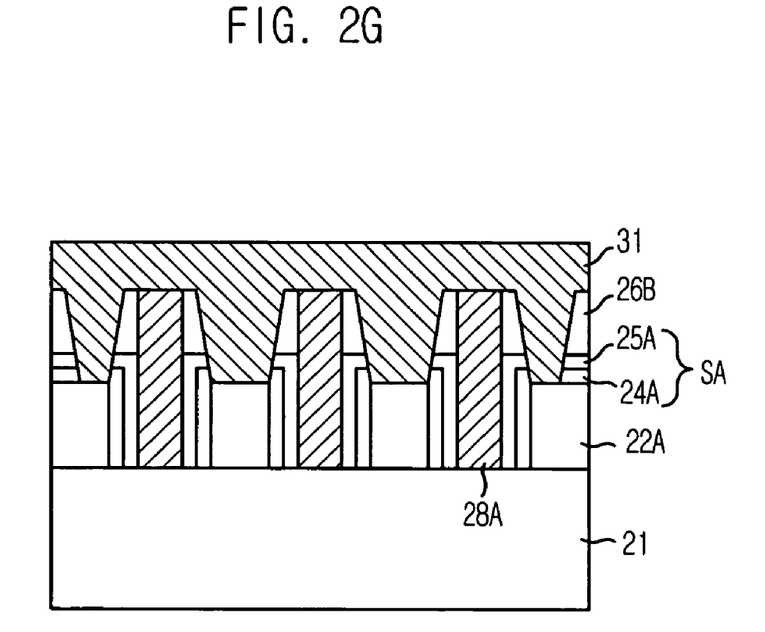

As shown in FIG. 2G, a tungsten silicide layer 31 is formed over the above resulting structure, filling the openings 30.

Figure 2H:
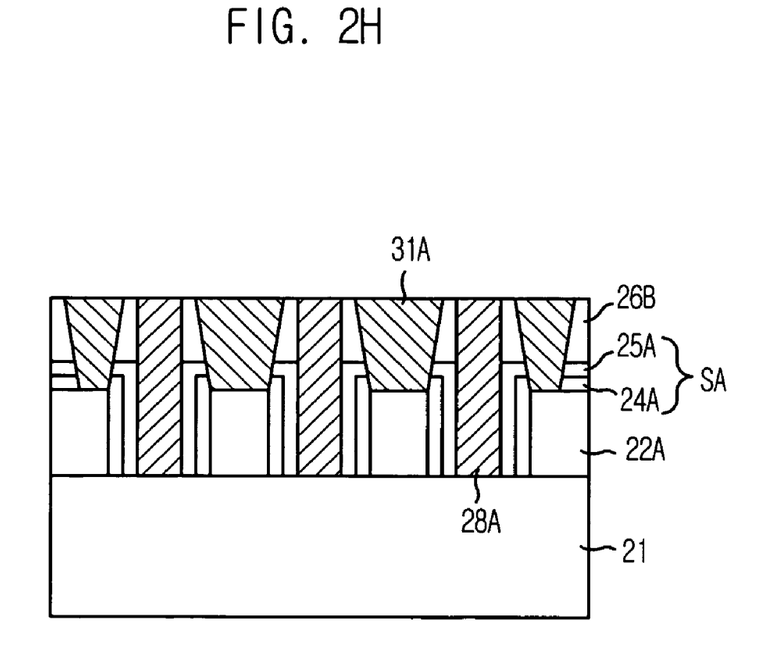

As shown in FIG. 2H, an etch-back process or a CMP process is performed on the tungsten silicide layer 31. As a result, the tungsten silicide layer 31 is planarized, thereby forming a plurality of second gate lines. Herein, the planarized tungsten silicide layer is denoted with a reference numeral 31A.

At this time, a critical dimension of the individual second gate line is smaller than that of the individual first gate line.

As described above, a gate line process is performed by being divided into two steps to control a critical dimension of the gate line and prevent an incidence that a landing plug contact is not opened properly. During the formation of the first gate lines G, the gate critical dimension is controlled, and the second gate lines are formed through a damascene process.

Also, to prevent the contact not-open incidence, LPC holes are formed after the first gate lines G are formed. Thus, it is possible to stably form semiconductor devices because the gate critical dimension can be easily controlled.

It is also possible to prevent a contact failure such as a contact hole not-open incidence which induces a connection defect between a contact plug and an active region.

Furthermore, it is possible to improve reliability of devices and yields of products by preventing the contact failure.

The present application contains subject matter related to the Korean patent application No. KR 2005-0027361, filed in the Korean Patent Office on Mar. 31, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising:
    forming a plurality of first gate lines on a substrate;
    forming an insulation layer on the substrate and the first gate lines;
    selectively etching the insulation layer disposed between the first gate lines to form a plurality of first openings;
    after forming the first gate lines, forming a plurality of landing plugs buried into the first openings;
    etching the insulation layer disposed on the first gate lines until upper portions of the first gate lines are exposed, to obtain a plurality of second openings; and
    after forming the landing plugs, forming a plurality of second gate lines inside the second openings,
    wherein the forming of the second gate lines includes:
    forming a conductive layer over the further etched insulation layer, filling the second openings; and
    planarizing the conductive layer until the landing contact plugs are exposed.

2. The method of claim 1, wherein the first openings are landing plug contact holes.

3. The method of claim 1, wherein the forming of the landing plugs includes:
    forming a conductive layer inside the first openings; and
    planarizing the conductive layer until the insulation layer is exposed by performing one of a chemical mechanical polishing (CMP) process and an etch-back process.

4. The method of claim 1, wherein a critical dimension of the individual second gate line is smaller than that of the individual first gate line.

5. The method of claim 1, wherein the insulation layer uses a layer selected from the group consisting of a borosilicate glass (BSG) layer, a borophosphosilicate glass (BPSG) layer, a phosphosilicate glass (PSG) layer, a tetraethyl orthosilicate (TEOS) layer, a high density plasma (HDP) layer, a spin-on-glass (SOG) layer, an advanced planarization layer (APL), an inorganic based low-k dielectric material, and organic based low-k dielectric material.

6. The method of claim 3, wherein the landing plugs are formed by using one of a polysilicon layer and an epitaxial silicon layer.

7. The method of claim 1, wherein the first gate lines are formed with a thickness ranging from approximately 200 Å to approximately 1,000 Å.

8. The method of claim 1, wherein the forming of the first gate lines includes:
    forming a gate oxide layer on the substrate;
    forming a gate conductive layer on the gate oxide layer;
    forming photoresist patterns on the gate conductive layer; and
    patterning the gate oxide layer and the gate conductive layer by using the photoresist pattern as an etch mask, thereby obtaining the first gate lines.

9. The method of claim 8, wherein the forming of the first gate lines further includes:
    forming a thin layer for spacers on the first gate lines and the substrate; and
    etching portions of the thin layer disposed on the substrate, thereby obtaining spacers on sidewalls of the first gate lines.

10. The method of claim 9, wherein the thin layer is formed in a stack structure of a silicon oxide layer and a silicon nitride layer.

11. The method of claim 8, wherein the critical dimension of the first gate lines is controlled by the gate conductive layer.

12. The method of claim 11, wherein the gate conductive layer is a polysilicon layer.

13. The method of claim 1, wherein the second gate lines is formed through a damascene process.

* * * * *